(12) United States Patent
Neuendorffer

(10) Patent No.: US 7,869,452 B1
(45) Date of Patent: Jan. 11, 2011

(54) DATAFLOW FIFO COMMUNICATION BUFFER USING HIGHLY-MULTIPORTED MEMORIES

(75) Inventor: Stephen A. Neuendorffer, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 602 days.

(21) Appl. No.: 11/880,160

(22) Filed: Jul. 19, 2007

(51) Int. Cl.
- *H04L 12/28* (2006.01)
- *H04L 12/56* (2006.01)
- *H04L 1/00* (2006.01)
- *H04L 12/26* (2006.01)

(52) U.S. Cl. .................. 370/414; 370/416; 370/418; 370/235.1

(58) Field of Classification Search ......... 370/412–418, 370/235.1
See application file for complete search history.

(56) References Cited

U.S. PATENT DOCUMENTS

| 5,179,680 | A | 1/1993 | Colwell et al. |
| 5,664,116 | A | 9/1997 | Gaytan et al. |
| 6,067,298 | A | * | 5/2000 | Shinohara ............... 370/395.71 |
| 6,275,920 | B1 | | 8/2001 | Abercrombie et al. |
| 7,038,952 | B1 | | 5/2006 | Zack et al. |
| 7,260,688 | B1 | | 8/2007 | Baxter et al. |
| 7,489,259 | B2 | | 2/2009 | Savell |
| 7,594,047 | B2 | | 9/2009 | Luk |
| 2003/0189947 | A1 | * | 10/2003 | Beshai ....................... 370/428 |
| 2005/0021628 | A1 | * | 1/2005 | Johansson ................... 709/205 |
| 2008/0031129 | A1 | * | 2/2008 | Arseneault et al. .......... 370/218 |
| 2008/0205278 | A1 | * | 8/2008 | Garmire et al. ............. 370/235 |

OTHER PUBLICATIONS

U.S. Appl. No. 12/198,733, filed Aug. 26, 2008, Schumacher et al.

* cited by examiner

*Primary Examiner*—Ronald Abelson
(74) *Attorney, Agent, or Firm*—Thomas A. Ward; Kevin T. Cuenot; Thomas George

(57) ABSTRACT

A FIFO communication system is provided using a FIFO and connection circuit to transmit data from a single source to multiple sinks. The connection circuit operates to enable simultaneous reads by the multiple sinks with a single output port FIFO. Multiple FIFOs can likewise be used to distribute data from a single source to multiple sinks without requiring a simultaneous read by both sinks. Similarly, a multiple output port FIFO can be used to supply multiple sinks without requiring simultaneous reads and without requiring additional memory use.

10 Claims, 4 Drawing Sheets

DATAFLOW FIFO COMMUNICATION BUFFER USING HIGHLY-MULTIPORTED MEMORIES

BACKGROUND

1. Technical Field

Embodiments of the present invention relate to features of a Field Programmable Gate Array (FPGA) programmed to form a system including a First In First Out (FIFO) communication buffer. More particularly, the present invention relates to efficient implementation of FIFO communication buffers to distribute data from a single source to multiple data sink devices.

2. Related Art

Conventional processor based systems use some form of memory controller in order to access memory devices and provide arbitration for devices connected to the memory controller ports, such as processors or other peripherals. To address the need to configure a memory controller to provide maximum bandwidth when used with various processor systems, a programmable logic device such as a Field Programmable Gate Array (FPGA) has been used to create the memory controller. FPGAs can be used to provide a wide variety of these memory controllers, including single port and multiport memory controllers.

Traditional PLDs such as Field Programmable Gate Arrays (FPGAs) and Complex PLDs (CPLDs) are programmable to form modules that are networked together to communicate. The modules may be complex core devices such as soft processors constructed using FPGA logic, or other less complex components. With the modules potentially operating at different speeds, operating within different clock domains, or otherwise requiring data to be buffered between the modules for communication, a First in First out (FIFO) communication buffer is typically used to interconnect the cores. The FIFOs are often implemented with internal memory, or a combination of registers or other components of the FPGA.

FIG. 1 illustrates the interconnection of modules 2 and 4 using a FIFO 6. The FIFO 6 shown is unidirectional, with a data input (DATAIN) connected to a source module 2 and a data output (DATAOUT) connected to a sink module 4. The signal VALIDIN is asserted when input data from the source 2 is ready for transmission. Similarly, VALIDOUT is asserted from the FIFO 6 when data is stored in the FIFO for transmission. The signal STALLIN is asserted from the FIFO 6 when the FIFO becomes full and cannot accept additional data. Similarly, STALLOUT is asserted from the sink 4 when it is unable to accept data from the FIFO.

FIG. 2 illustrates more details of the FIFO 6 comprising FIFO memory 8 and its FIFO control logic 10. The FIFO memory 8 includes a data input (DA) for receiving the data input signal (DATAIN) and a data output (DB) for receiving the data output signal (DATAOUT). The input data is stored in the FIFO memory 8 at an address (ADDRA) provided from the FIFO control logic 10. Similarly, data read from the FIFO memory 8 is provided using an address (ADDRB) provided from the FIFO control logic 10. The FIFO memory 8 is clocked by a common clock signal CLK received at clock inputs (CLKA & CLKB). The B side output is enabled by a high applied to the enable input (ENB). With the FIFO memory 8 being unidirectional, writing at the output port is disabled by a low applied to the A side write enable input (WEB), while writing at the input port is enabled by a high applied to the B side write enable input (WEA).

The FIFO control logic 10 operates to address data for pushing and popping, and to send valid and stall signals. The FIFO control logic 10 generates the address signals (ADDRA) and (ADDRB) to control pushing or writing of data into memory locations of the FIFO memory 8, as well as to control popping or reading of data. The FIFO control logic 10 ensures that the output valid signal (VALIDOUT) is asserted if there is data in the FIFO memory 8. It further asserts a stall signal (STALLIN) if the FIFO memory 8 becomes full. If a stall signal is received from a sink module, the FIFO control logic 10 does not address a signal for reading at the output address (ADDRB). Similarly, if a valid signal (VALIDIN) is received from a source indicating data is being transmitted, a proper input address (ADDRA) is asserted.

For reference, a block diagram of components of a conventional FPGA that may be used to form source and sink modules and FIFOs that interconnect these modules is provided in FIG. 3. The FPGA includes input/output (IOBs) blocks 32 (each labeled 10) located around the perimeter of the FPGA, multi-gigabit transceivers (MGT) 34 interspersed with the I/O blocks 32, configurable logic blocks 36 (each labeled CLB) arranged in an array, block random access memory 38 (each labeled BRAM) interspersed with the CLBs, configuration logic 33, a configuration interface 31, an on-chip processor 16, and an internal configuration access port (ICAP) 35. The FPGA also includes a programmable interconnect structure (not shown) made up of traces that are programmably connectable between the CLBs 36 and IOBs 32 and BRAMs 38.

The configuration memory array 37 typically includes millions of the SRAM memory cells lying beneath the structure shown in FIG. 3. The configuration memory cells are programmed to configure the CLBs 36, IOBs 32, BRAMs 38 and appropriately connect the interconnect lines. Source and sink modules can be formed from these elements, as well as FIFOs. The BRAM memory 38, in particular, can be used to form a FIFO memory such as device 8 in FIG. 2, while simpler FIFO memories can be formed from registers or logic in the CLBs. The configuration memory array 37 programmed for the configuration can be visualized as a rectangular array of bits. The bits are grouped into frames that are one-bit wide words that extend in columns from the top of the array to the bottom. The configuration data values are typically loaded into the configuration memory array one frame at a time from the external store via the configuration interface 31.

In general, the FPGA of FIG. 3 is configured in response to a set of configuration data values that are loaded into a configuration memory array of the FPGA from an external store via configuration interface 31. The configuration logic 33 provides circuitry for programming of the configuration memory array cells 31 typically at startup. The FPGA can be reconfigured by rewriting data in the configuration memory array 31. In one reconfiguration method, the ICAP 35 is used to rewrite data in the configuration memory array in order to generate or instantiate the FPGAs internal logic (e.g., CLBs 36 and BRAMs 38). Without using the ICAP 35, reconfiguration can also be performed by loading reconfiguration frames through the configuration interface 31 using external customized logic components to over-write frame data in the configuration memory array.

It would be desirable to use the structure of an FPGA to provide an improved FIFO communication buffer for interconnecting modules. In particular, it would be desirable to provide a FIFO communication buffer and operation method that provides low-latency high-throughput data transfer to multiple sink modules while minimizing the amount of memory required for the FIFO memory.

SUMMARY

According to embodiments of the present invention, a design is provided for a communication system in an FPGA using a FIFO communication buffer to transmit data from a single source to multiple sinks.

Embodiments of the communication system include FIFO connection logic for interconnecting the FIFO communication buffer and the multiple sinks. The FIFO connection logic meets the requirement that the multiple sinks read from the single FIFO output simultaneously to assure both receive the data before it is erased from the FIFO.

In another embodiment, FIFO connection logic is provided between the output of a source and the inputs of two FIFOs to enable a single source module to supply two separate sinks. This configuration uses additional FIFOs, and may incur additional communication latency but does not require the sinks to simultaneously read from the FIFOs.

In another embodiment, a FIFO communication buffer is provided with multiple addressable output ports and associated control logic. This embodiment allows a single sink module to drive multiple sinks using the multi-output port FIFO communication buffer without requiring simultaneous reads. The dual output ported FIFO communication buffer further allows one data transfer per cycle, similar to the single output ported FIFO communication buffer that uses a simultaneous data read from multiple sink modules.

BRIEF DESCRIPTION OF THE DRAWINGS

Further details of the present invention are explained with the help of the attached drawings in which.

DETAILED DESCRIPTION

Figure 1:
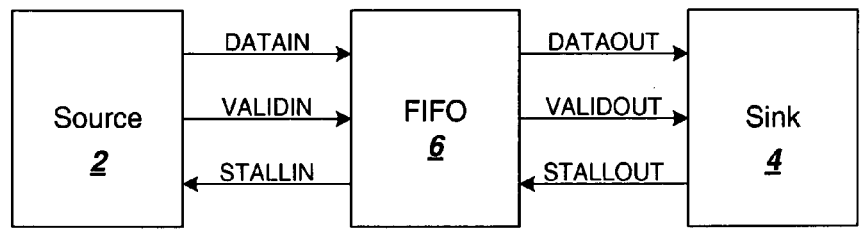
FIG. 1 is a block diagram depicting a prior art communication connection between a source module and a sink module using a FIFO communication buffer.
Figure 2:
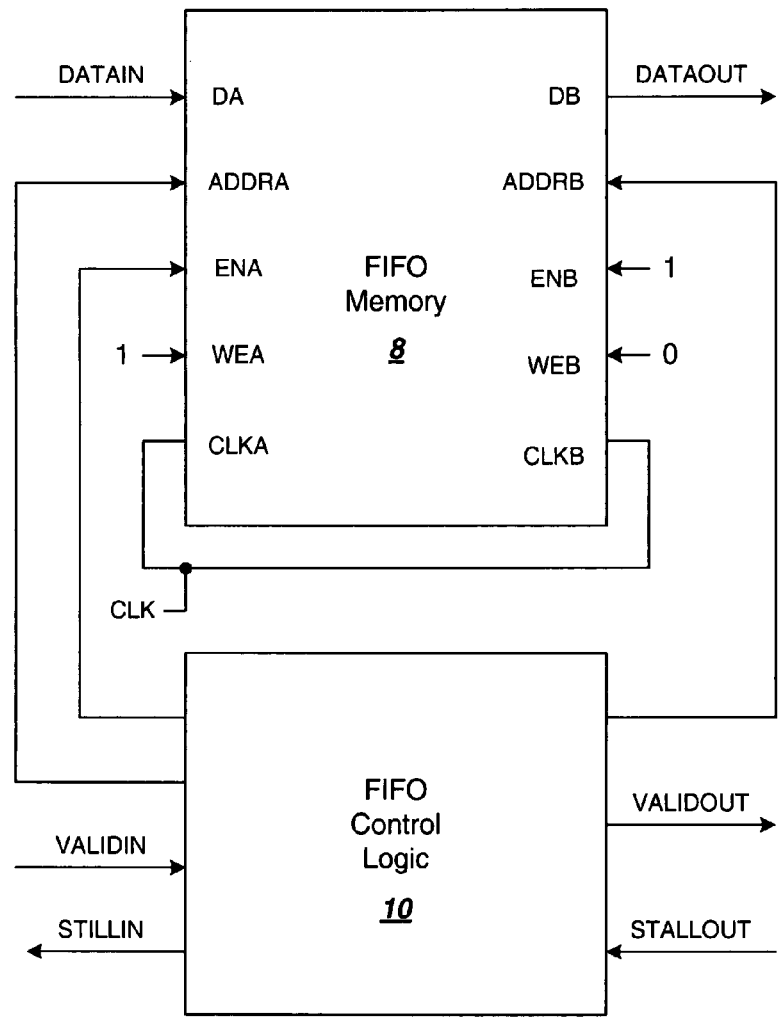
FIG. 2 illustrates further details of the FIFO memory and the associated FIFO control logic for the system of FIG. 1.
Figure 3:
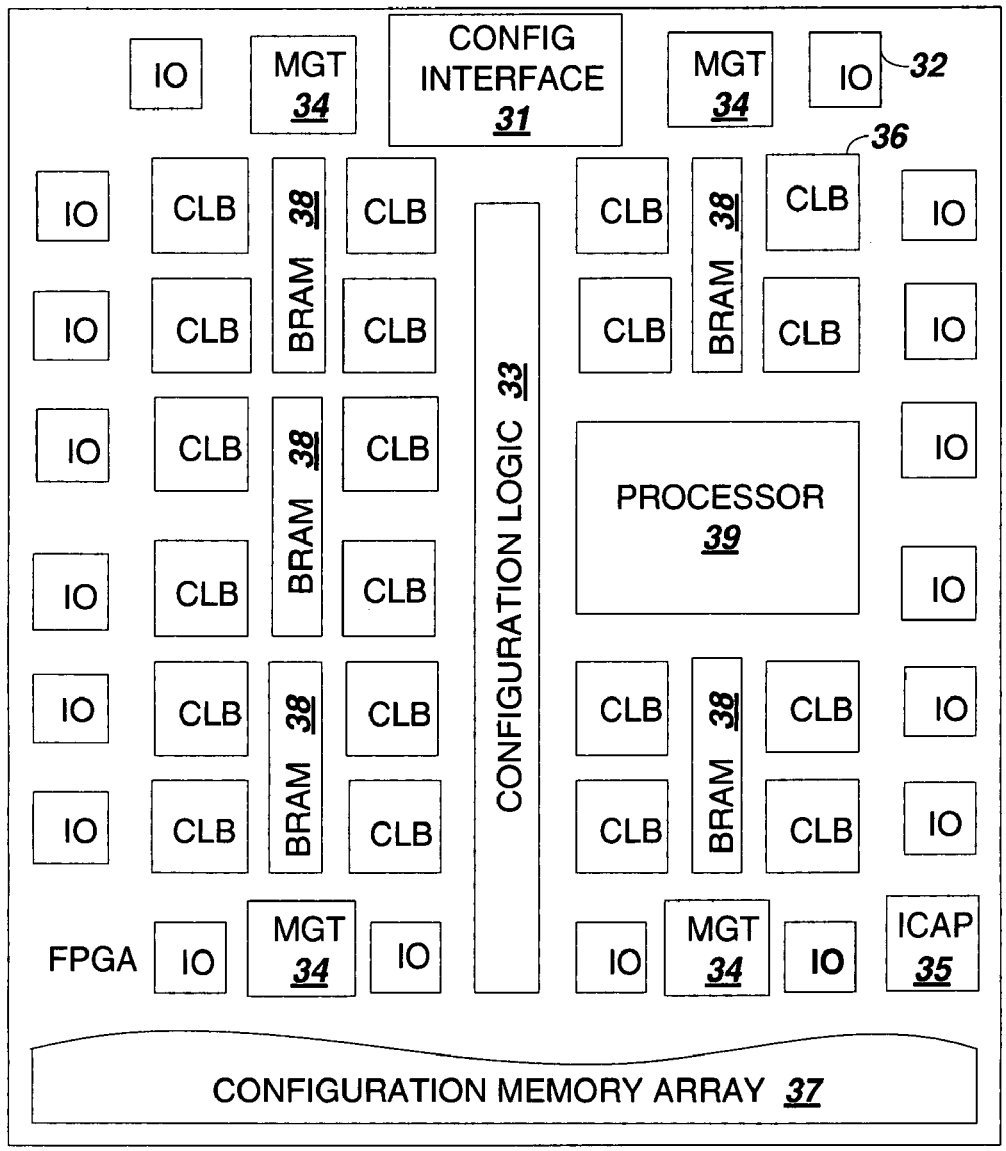
FIG. 3 is a block diagram depicting conventional components of an FPGA that can be used to create a memory communication system using a FIFO.
Figure 4:
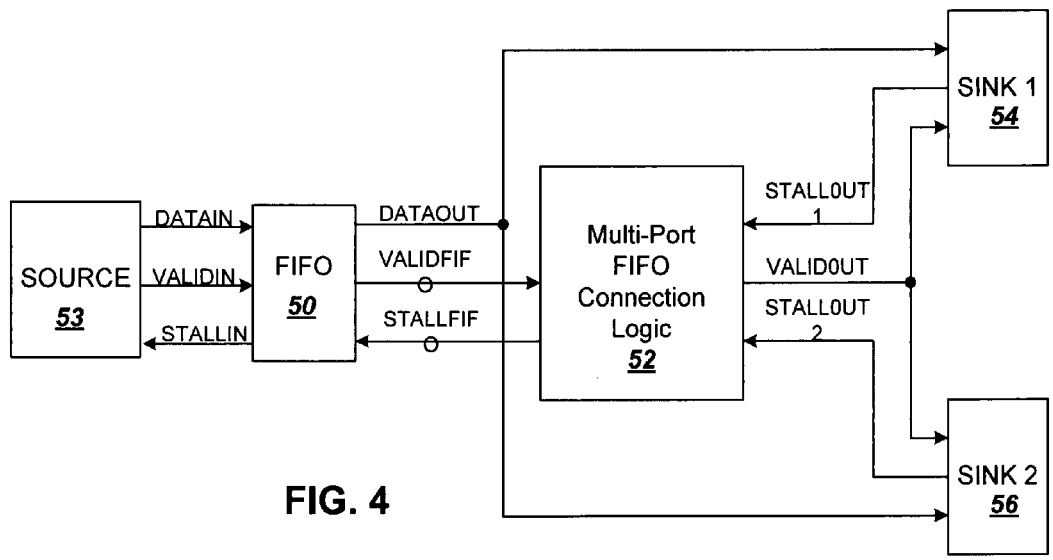
FIG. 4 is a block diagram illustrating additional control logic to provide a communication link from a single source module through a single FIFO to two separate sink modules in accordance with an embodiment of the present invention.

FIG. 4 shows an embodiment of the present invention with FIFO connection logic 52 and FIFO 50 providing signals from a source 53 to two separate sink modules 54 and 56. The source 53 provides data to FIFO 50 to distribute to sinks 54 and 56 over the DATAIN line and asserts VALIDIN when the data is ready for sending. The FIFO 50 provides a STALLIN signal in response if it is full, but otherwise accepts the data for distribution. Once data is in the FIFO 50 from the source 53, the FIFO connection logic 52 monitors the VALIDFIFO signal from FIFO 50 and separate stall signals: STALLOUT1 from sink 54 and STALLOUT2 from sink 56. Data is then provided from the FIFO 50 directly to sinks 54 and 56 based on control signals received from FIFO connection logic 52.

If the FIFO 50 has data to send, it will assert the VALIDFIFO. STALLFIFO will be asserted from connection logic 52 if either the STALLOUT1 indicates SINK1 is busy or STALLOUT2 indicates sink 56 is busy. When data is available in FIFO 50 as indicated by the signal VALIDFIFO, VALIDOUT is asserted by FIFO connection logic 52. Since data is provided from a single port of FIFO 50, it must remain available until received by both sinks 54 and 56.

Figure 5:
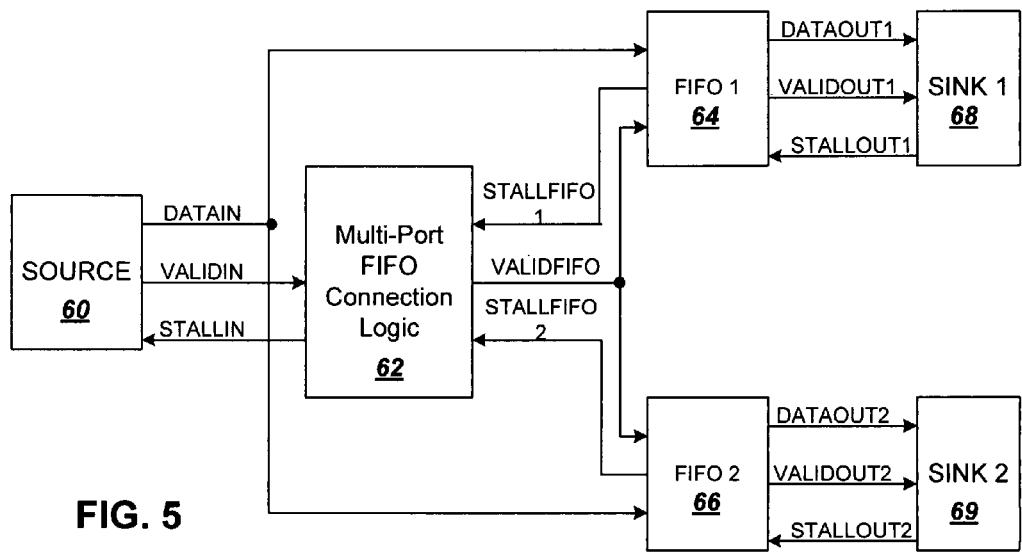
FIG. 5 shows an alternative communication data link from a single source module to two separate sink modules utilizing additional FIFO connection logic and two separate FIFO memories, in accordance with an embodiment of the present invention.

FIG. 5 illustrates another communication data link from a single source module to two separate sink modules utilizing additional FIFO connection logic and two separate FIFO memories in accordance with an embodiment of the present invention. In this embodiment, data transfer is allowed from a single source 60 to two sinks 68 and 69 that may enable sinks 68 and 69 to read different data at the same time. In FIG. 5, two separate FIFOs 64 and 66 are used, one for each of two sinks 68 and 69. Although this configuration avoids the need for a concurrent read of data from the source 60 by sinks 68 and 69, it can use significantly more storage for the FIFO memories included in FIFOs 64 and 66.

The FIFO connection logic 62 operates in FIG. 5 to connect communications between the source 60 and FIFOs 64 and 66. The FIFO connection logic 62 monitors the VALIDIN signals from source 60 and separate stall signals, STALLFIFO1 from FIFO 64 and STALLFIFO2 from FIFO memory 66. Data is provided from the source 60 directly to FIFOs 64 and 66 based on control signals received from the FIFO connection logic 62. If the source 60 has data to send, it will assert the VALIDIN. STALLIN will be asserted from FIFO connection logic 62 if either the STALLFIFO1 indicates FIFO 64 is full or STALLFIFO2 indicates FIFO 66 is full. When data is ready from source 60 as indicated by the signal VALIDIN, VALIDFIFO is asserted by FIFO connection logic 62.

Once data is distributed to both FIFO memories 64 and 66, communication occurs directly between the FIFOs 64 and 66 and individual sinks 68 and 69. In particular, FIFO 64 sends data signals DATAOUT1 as governed by signals VALIDOUT1 and STALLOUT1. FIFO 66 sends data signals DATAOUT2 as governed by signals VALIDOUT2 and STALLOUT2.

Figure 6:
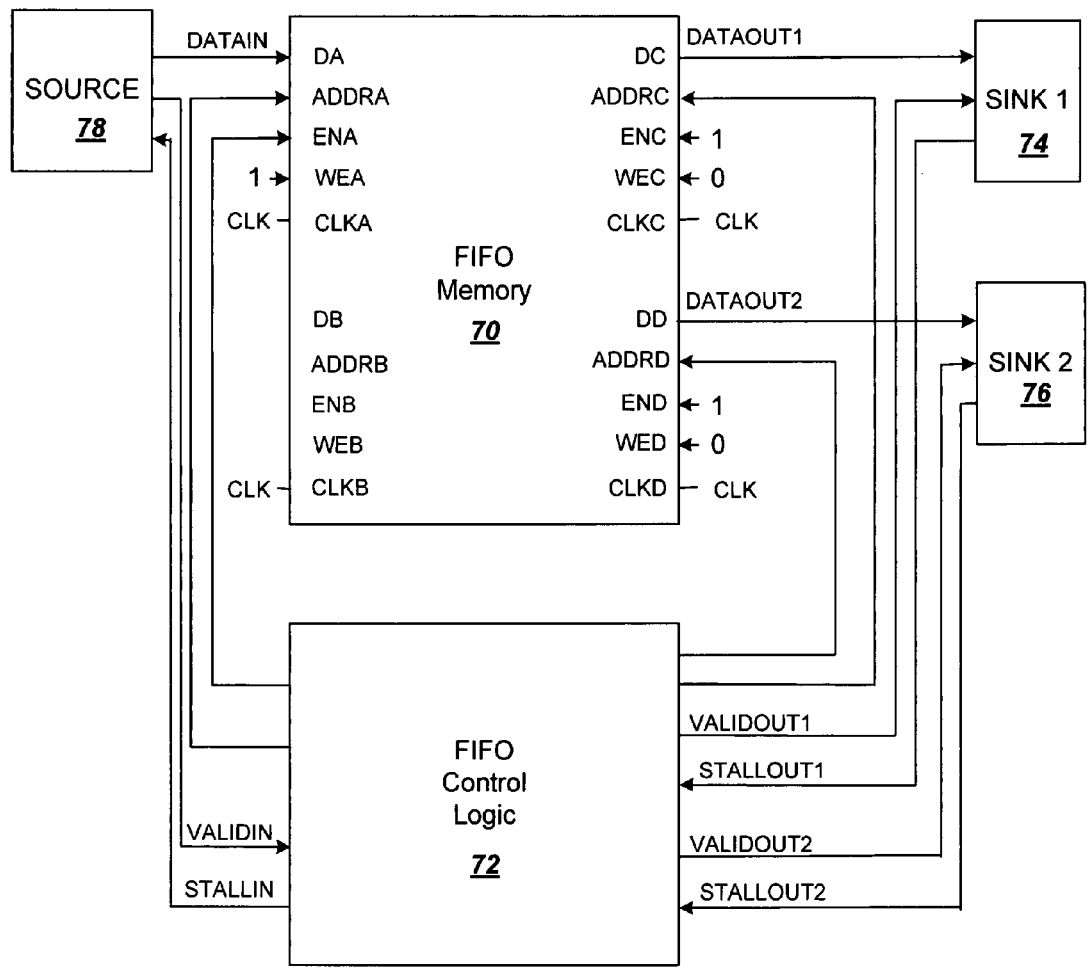
FIG. 6 shows details of a FIFO memory and its associated FIFO control logic, with the FIFO memory having two outputs allowing for creation of a system similar to FIG. 4, but without requiring the sinks to read data simultaneously from the FIFO, in accordance with an embodiment of the present invention.

FIG. 6 shows details of a FIFO memory 70 and its associated FIFO control logic 72, with the FIFO memory 70 having two outputs allowing for creation of a system similar to FIGS. 4 and 5, but that may enable the sinks to read different data at the same time using a single FIFO memory. As shown, the FIFO memory 70 includes an input port receiving signals labeled DA from a source 78, and two output ports providing signals labeled DC to sink 74 and signals labeled DD to sink 76. All of the ports of FIFO memory 70 are clocked with a common clock CLK. The DC and DD output ports are enabled with a high signal provided at respective enable ports ENC and END, while writing is disabled with a low signal at write enable ports WEC and WED. The input port DA is write enabled with a high provided at the write enable port WEA. An additional access port to the memory, made up of DB, ADDRB, ENB, and WEB is left unused.

The FIFO control logic 72 of FIG. 6 receives and provides stall and valid signals, and uses these signals to generate address signals for the FIFO memory 70. With a VALIDIN signal received from source 78, the FIFO control logic 72 realizes data is read at data input port DA, and provides an address ADDRA to FIFO memory 70 for storage of the data. The FIFO control logic 72 is implemented so that as data is written into the FIFO memory 70, ADDRA is incremented to approach ADDRC and ADDRD. The addresses ADDRC and ADDRC are incremented as data is read out of the FIFO memory 70. Only after data is read from output ports DC and DD to both sinks is the data element no longer stored in the FIFO memory 70, enabling the corresponding location in the FIFO memory 70 to be overwritten with new data. For a later read of the data out of FIFO memory 70, address signals ADDRC and ADDRD are provided to the output ports from the FIFO control logic 72 to enable read out in a first-in-first-out manner.

The FIFO control logic 72 generates STALLIN, VALIDOUT1, VALIDOUT2 and ENA according to the relative locations of ADDRA, ADDRC and ADDRD. The address ADDRC and ADDRD are maintained independently. The VALIDOUT1 signal from FIFO control logic 72 provided to sink 74 is derived from ADDRC indicating data is available from DC, while VALIDOUT2 provided to sink 76 is derived from ADDRD to indicate data is available from DD. The signal STALLIN is generated by the FIFO control logic 72 and sent to source 78 when the FIFO memory 70 is full.

Using the FIFO memory 70 and associated FIFO control logic 72 of FIG. 6, one data transfer per clock cycle can be made for the source 78 and each sink 74 and 76, similar to FIG. 4.

Although shown with only two sinks 74 and 76 in FIG. 6, as well as in FIGS. 4 and 5, alternative embodiments of the present invention provide for data to be transferred from a single source to multiple sinks. In FIG. 6, the multiple sinks will require additional valid and stall signals from the FIFO control logic 72, and multiple output ports for the FIFO memory 70. Similarly, additional components will be required to convey signals from a single source to more than two sinks in FIGS. 4 and 5.

Although shown with only a single clock signal CLK in FIG. 6, alternative embodiments of the present invention may provide for a single source and multiple sinks with independent clock signals which may be phase-aligned or not phase-aligned. In particular, the use of independent, not phase-aligned clock signals may require more control logic and possibly additional signals, depending on the asynchronous design style.

Although embodiments of the present invention have been described above with particularity, this was merely to teach one of ordinary skill in the art how to make and use the invention. Many additional modifications will fall within the scope of the invention, as that scope is defined by the following claims.

What is claimed is:

1. A system for transmitting data, the system comprising:
   a data source;
   a first data sink;
   a second data sink;
   a First-In-First-Out (FIFO) communication buffer having a data input connected to the data source and a data output connected to the first data sink and to the second data sink; and
   a FIFO connection circuit that connects to the FIFO communication buffer, wherein:
   the FIFO connection circuit receives a stall signal from the first data sink or the second data sink to indicate when either the first data sink or the second data sink is busy, the FIFO connection circuit separates the stall signal from the first data sink or the second data sink and provides a responsive stall signal to the data source, and
   the FIFO connection circuit receives a data valid signal from the FIFO communication buffer indicating the FIFO communication buffer has data to send from the source, the FIFO connection circuit providing a responsive data valid signal to the first data sink and the second data sink,
   wherein based on control signals from the FIFO connection circuit, the data is sent directly from the FIFO communication buffer to the first data sink or the second data sink bypassing the FIFO connection circuit.

2. The system of claim 1, wherein a same data element is read out of the FIFO communication buffer during each clock cycle by the first sink and the second sink.

3. The system of claim 1, further comprising:
   at least one additional data sink,
   wherein the FIFO communication buffer has data outputs connected to the at least one additional data sink, and
   wherein the FIFO connection circuit receives a stall signal from the at least one additional data sink to indicate when the at least one additional data sink is busy, the FIFO connection circuit then providing the responsive stall signal to the data source, and
   wherein the FIFO connection circuit receives a data valid signal from the FIFO memory indicating the FIFO communication buffer has data to send from the source, the FIFO connection circuit providing the responsive data valid signal to the at least one additional data sink.

4. The system of claim 1, wherein the system comprises a Field Programmable Gate Array (FPGA).

5. The system of claim 1, wherein responsive to the FIFO connection circuit receiving a data valid signal from the FIFO communication buffer indicating the FIFO communication buffer has data to send from the source, the FIFO connection circuit is configured to provide a data valid signal to the first data sink and the second data sink concurrently.

6. A system for transmitting data, the system comprising:
   a first First In First Out (FIFO) communication buffer having a data input and input control terminals, and a data output and output control terminals;
   a first data sink connected to the data output and the output control terminals of the first FIFO communication buffer;
   a second FIFO communication buffer having a data input and input control terminals, and a data output and output control terminals;
   a second data sink connected to the data output and the output control terminals of the second FIFO communication buffer;
   a data source having a data terminal connected to the data input of the first FIFO communication buffer and the second FIFO communication buffer, and control terminals; and
   a FIFO connection circuit configured to provide a source stall signal to the control terminals of the data source and receive a first stall signal from the first FIFO communication buffer and a second stall signal from the second FIFO communication buffer, wherein the FIFO connection circuit is configured to assert the source stall signal responsive to assertion of either the first stall signal or the second stall signal, and wherein based on control signals from the FIFO connection circuit, data is passed from the data terminal of the data source to the first FIFO communication buffer and the second FIFO communication buffer bypassing the FIFO connection circuit.

7. The system of claim 6, further comprising:
at least one additional FIFO communication buffer having a data input and input control terminals, and a data output and output control terminals;
at least one additional data sink connected to the data output and the output control terminals of the at least one additional FIFO communication buffer,
wherein the data source has a data terminal connected to the data input of the at least one additional FIFO communication buffer, and
wherein the FIFO connection circuit connects the control terminals of the data source to the input control terminals of the at least one additional FIFO communication buffer so that the data from the data source can be received at the at least one additional FIFO communication buffer.

8. The system of claim 6, wherein the first data sink and the second data sink are configured to read different portions of data sent from the data source and received within the first and second FIFO communication buffers respectively at a same time.

9. The system of claim 6, wherein the data source sends data to the first FIFO communication buffer and the second FIFO communication buffer concurrently.

10. The system of claim 6, wherein the FIFO connection circuit is further configured to receive a valid data signal from the data source and assert a valid FIFO signal to the first FIFO communication buffer and the second FIFO communication buffer, wherein the FIFO connection circuit initiates a data transfer from the data source to the first FIFO communication buffer and the second FIFO communication buffer by asserting the valid FIFO signal to each of the first FIFO communication buffer and the second FIFO communication buffer responsive to assertion of the valid data signal from the data source.

\* \* \* \* \*